US007673194B1

(12) United States Patent
Sun et al.

(10) Patent No.: US 7,673,194 B1
(45) Date of Patent: Mar. 2, 2010

(54) APPARATUS AND METHOD FOR INITIALIZING AN INTEGRATED CIRCUIT DEVICE AND ACTIVATING A FUNCTION OF THE DEVICE ONCE AN INPUT POWER SUPPLY HAS REACHED A THRESHOLD VOLTAGE

(75) Inventors: Chung Sun, San Jose, CA (US); Eddy Huang, San Jose, CA (US); Stephen Chan, Alhambra, CA (US)

(73) Assignee: Actel Corporation, Mountain View, CA (US)

( * ) Notice: Subject to any disclaimer, the term of this patent is extended or adjusted under 35 U.S.C. 154(b) by 307 days.

(21) Appl. No.: 11/844,569

(22) Filed: Aug. 24, 2007

Related U.S. Application Data

(62) Division of application No. 10/318,281, filed on Dec. 11, 2002, now Pat. No. 7,310,760.

(51) Int. Cl.
*G11C 29/00* (2006.01)
(52) U.S. Cl. .............................. 714/718; 327/143; 713/2
(58) Field of Classification Search ................. 714/718; 327/143; 713/2
See application file for complete search history.

(56) References Cited

U.S. PATENT DOCUMENTS

| 4,300,065 | A |   | 11/1981 | Remedi et al. |   |
|---|---|---|---|---|---|
| 4,320,386 | A |   | 3/1982 | Harris |   |
| 4,405,871 | A |   | 9/1983 | Buurma et al. |   |
| 4,434,403 | A |   | 2/1984 | Chang |   |
| 4,611,126 | A | * | 9/1986 | Miller | 307/64 |
| 4,634,905 | A | * | 1/1987 | Campbell, Jr. | 327/143 |
| H497 | H |   | 7/1988 | Piasecki |   |
| 4,812,679 | A | * | 3/1989 | Mahabadi | 327/143 |
| 4,818,904 | A |   | 4/1989 | Kobayashi |   |
| 4,900,950 | A | * | 2/1990 | Dubujet | 327/143 |
| 5,136,181 | A | * | 8/1992 | Yukawa | 327/143 |
| 5,212,412 | A |   | 5/1993 | Atriss et al. |   |
| 5,243,233 | A | * | 9/1993 | Cliff | 327/143 |
| 5,323,066 | A | * | 6/1994 | Feddeler et al. | 327/142 |

(Continued)

FOREIGN PATENT DOCUMENTS

JP 09116431 A 5/1997

OTHER PUBLICATIONS

Yasuda et al., A Power-On Reset Pulse Generator For Low Voltage Applications, 2001, IEEE, pp. iv-598-iv-601.

*Primary Examiner*—M. Mujtaba K Chaudry
(74) *Attorney, Agent, or Firm*—Lewis and Roca LLP

(57) ABSTRACT

An apparatus for generating a function activation signal to activate a function in an integrated circuit device comprises a power-on circuit receiving a power input and initializing and generating a test activation signal, a test circuit receiving the test activation signal and generating a test result signal, and a threshold decision circuit receiving the test result signal and generating the function activation signal. The test circuit models a function of the integrated circuit device and generates the test result signal when the power input has reached a sufficient voltage to perform the function of the integrated circuit device. The threshold decision circuit generates the function activation signal if the test result signal indicates the power input has reached a sufficient voltage to perform the function of the integrated circuit device.

21 Claims, 15 Drawing Sheets

U.S. PATENT DOCUMENTS

| | | | |
|---|---|---|---|
| 5,394,104 A * | 2/1995 | Lee | 327/143 |
| 5,485,111 A | 1/1996 | Tanimoto | |
| 5,568,100 A | 10/1996 | Locanthi | |
| 5,703,510 A * | 12/1997 | Iketani et al. | 327/143 |
| 5,734,280 A * | 3/1998 | Sato | 327/143 |
| 5,831,460 A | 11/1998 | Zhou | |
| 5,883,532 A | 3/1999 | Bowers | |
| 5,929,674 A | 7/1999 | Maccarrone et al. | |
| 6,009,012 A * | 12/1999 | Sibigtroth et al. | 365/185.04 |
| 6,016,068 A | 1/2000 | Ding | |
| 6,075,718 A * | 6/2000 | Fontana et al. | 365/94 |
| 6,118,709 A | 9/2000 | Zink et al. | |
| 6,144,237 A | 11/2000 | Ikezaki | |
| 6,144,238 A * | 11/2000 | Dasgupta | 327/143 |
| 6,154,388 A | 11/2000 | Oh | |
| 6,204,703 B1 * | 3/2001 | Kwon | 327/143 |
| 6,329,851 B1 | 12/2001 | Murphy | |
| 6,329,852 B1 | 12/2001 | Seo | |
| 6,367,024 B1 * | 4/2002 | Ezell | 713/340 |
| 6,566,919 B2 * | 5/2003 | Nguyen | 327/143 |
| 7,310,760 B1 | 12/2007 | Sun et al. | |
| 7,426,667 B1 | 9/2008 | Sun et al. | |

\* cited by examiner (A) Oscillator with Reset (B) Waveforms (A) Frequency Divider (B) Waveforms

APPARATUS AND METHOD FOR INITIALIZING AN INTEGRATED CIRCUIT DEVICE AND ACTIVATING A FUNCTION OF THE DEVICE ONCE AN INPUT POWER SUPPLY HAS REACHED A THRESHOLD VOLTAGE

CROSS-REFERENCE TO RELATED APPLICATION

This application is a divisional of co-pending U.S. patent application Ser. No. 10/318,281, filed Dec. 11, 2002, which is hereby incorporated by reference as if set forth herein.

BACKGROUND OF THE DISCLOSED SYSTEM

1. Field of the Disclosed System

The present disclosed system relates to field-programmable gate arrays, and more particularly, to an apparatus and method for creating power-on-reset and clock signals for memory operation immediately after applying a power supply.

2. Description of the Related Art

A field-programmable gate array (FPGA) is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing all Boolean functions of a few variables. The cell types are not restricted to gates. For example, configurable functional groups ("FGs") typically include memory cells and connection transistors that may be used to configure logic functions such as addition, subtraction, etc., inside of the FPGA. A cell may also contain at least one flip-flop. Some types of logic cells found in FPGAs are those based on multiplexers and those based on programmable read only memory (PROM) table-lookup memories. Erasable FPGAs can be reprogrammed many times. This technology is especially convenient when developing and debugging a prototype design for a new product and for small-scale manufacture.

FPGAs typically include a physical template that includes an array of circuits, sets of uncommitted routing interconnects, and sets of user programmable switches associated with both the circuits and the routing interconnects. When these switches are properly programmed (set to on or off states), the template or the underlying circuit and interconnect of the FPGA is customized or configured to perform specific customized functions. By reprogramming the on-off states of these switches, an FPGA can perform many different functions. Once a specific configuration of an FPGA has been decided upon, it can be configured to perform that one specific function.

The user programmable switches in an FPGA can be implemented in various technologies, such as ONO antifuse, M-M antifuse, SRAM memory cell, Flash EPROM memory cell, and EEPROM memory cell. FPGAs that employ fuses or antifuses as switches can be programmed only once. A memory cell controlled switch implementation of an FPGA can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

FPGAs can store the program that determines the circuit to be implemented in a RAM or PROM on the FPGA chip. The pattern of the data in this configuration memory ("CM") determines the cells' functions and their interconnection wiring. Each bit of CM controls a transistor switch in the target circuit that can select some cell function or make (or break) some connection. By replacing the contents of CM, designers can make design changes or correct design errors. The CM can be downloaded from an external source or stored on-chip. This type of FPGA can be reprogrammed repeatedly, which significantly reduces development and manufacturing costs.

In general, an FPGA is one type of programmable logic device (PLD), i.e., a device that contains many gates or other general-purpose cells whose interconnections can be configured or "programmed" to implement any desired combinational or sequential function. As its name implies, an FPGA is "field-programmable", meaning that the device is generally programmed by designers or end users "in the field" via small, low-cost programming units. This is in contrast to mask programmable devices which require special steps in the IC chip-manufacturing process.

A field-programming unit typically uses design software to program the FPGA. The design software compiles a specific user design, i.e., a specific configuration of the programmable switches desired by the end-user, into FPGA configuration data. The design software assembles the configuration data into a bit stream, i.e., a stream of ones and zeros, that is fed into the FPGA and used to program the configuration memories for the programmable switches or program the shift registers for anti-fuse type switches. The bit stream creates the pattern of the data in the configuration memory CM that determines whether each memory cell stores a "1" or a "0". The stored bit in each CM controls whether its associated transistor switch is turned on or off.

In RAM based FPGA devices, the memory array may be required to be cleared on power up so that the FPGA remains in an inactive state before loading the configuration bit stream mentioned above. The clearing operation usually occurs immediately after the power supply is applied to the FPGA. If the FPGA is on a circuit board and receives power from the circuit board, then the power supply to the FPGA may gradually rise to the operating voltage due to the large capacitance normally associated with circuit boards.

A RAM-based FPGA often draws a large power-up current. The initial power-up current required by the FPGA may be partially or completely due to unsuccessful attempts of the FPGA to clear its internal configuration memory. As the supplied voltage gradually rises to the operating voltage, the device begins attempting to clear the memory cells, but if the voltage is too low, the clearing operations will be unsuccessful. These unsuccessful clearing operations can draw significant current that is wasted on the device and by clamping down the voltage can increase the time it takes for the power supply voltage to reach operating levels. Clearing the configuration memory would be a burden on the external power supply if it has the requirement of having to supply a large initial current. In addition, the large initial current required to clear the configuration memory may also clamp down the power supply voltage to the FPGA due to resistance on the external power line and the bond wires from the FPGA package pins of power supply to the device.

FIG. 1a is a simplified schematic diagram illustrating a typical memory array 10 of a field programmable gate array. Memory array 10 comprises a plurality of memory cells 30.

Memory cell 30 will be discussed in greater detail below. Memory cells 30 are coupled to bit-bar lines 14 and row lines 18. Row lines 18 are coupled to a row address line 16 through a row decoder 15 comprising an AND gate 22, which represents the "Row Decoding Function Block", and a driver 24. Row address line 16 is coupled to row counter 17.

Bit-bar lines 14 are coupled to a column address line 20 through a column decoder 25 and bit driver 12. Column address line 20 is coupled to column counter 19. Column decoder 25 comprises a NAND gate 26, which represents the "Column Decoding Function Block". Bit-line driver 12 comprises a two-input NAND gate 28 having a first input coupled to column address line 20 through column decoder 25. Thus, when the memory clear bar 32 is at logic "0", all bit-bar lines 14 will be driven to logic "1." Two-input NAND gate 28 has a second input coupled to memory clear line 34, which is coupled to memory clear bar 32 during a memory clear operation. Memory array 10 typically contains all the configuration data in an FPGA device.

To address this problem, power-on-reset circuit blocks are used inside the FPGA to reset the programming and control logic circuitry on power-up of the device. For example, in an FPGA device, resetting the programming and control circuitry switches all programming elements to the same logic level (e.g., "0" or "low"). Then when the configuration bit stream is loaded into the device, only the elements to be programmed are accessed and switched. Power-on-reset circuit blocks are well known to those of ordinary skill in the art. Power-on-reset circuitry may also be used to inhibit memory clearing or programming when the main supply voltage ("VDD") is too low. Generally, the power-on-reset circuitry is an analog circuit and is sensitive to the transistor parameters and it is, therefore, very hard to track the actual minimum voltage required to clear or write to a memory cell ("VDD_MIN") with the power input voltage level that releases the power-on-reset signal when the process parameters or temperature change.

FIG. 1b is a simplified schematic diagram illustrating a typical memory cell 30 as commonly used in the memory array of FIG. 1a. Memory cell 30 usually requires a voltage above a minimum voltage level VDD_MIN in order to be successfully cleared or written. Memory cell 30 comprises a pair of cross-coupled pass transistors and is a type commonly used in FPGA devices and well known to those of ordinary skill in the art. The data is driven from a bit-line driver (not shown) onto the bit-line through a pass gate 38 having a gate coupled to row line 18 and through memory cell 30. Because of the variation of the fabrication process parameters, the parameters of the transistors of the memory cell will change. Thus, the VDD_MIN required to successfully clear or write memory cell 30 may be different from one FPGA device to another. Temperature may also affect the parameters of the transistors, and thus is an additional parameter that may effect VDD_MIN.

FIG. 2A is a simplified bock diagram of a conventional power-on-reset circuit block. A power-on-reset functional block 100 comprises a power-on-reset circuit which generates a reset signal (PORST) through reset signal line 104. Power-on-reset circuits are well known to those of ordinary skill in the art.

The timing diagram of FIG. 2B shows the voltage input to an integrated circuit device. As shown in the timing graph in FIG. 2B, when a power supply to, for example, a circuit board, is first switched on, the power supplied to the integrated circuit device takes some time to reach the operational voltage level.

A conventional power-on-reset circuit block sends a reset signal once the supply voltage has reached a pre-determined level. For example, analog circuitry within the power-on-reset circuit block may be used to determine when the supply voltage has reached a certain level. This level is set at a constant figure by the characteristics of the analog circuit. For various reasons, the predetermined level may or may not correspond to the actual level required to reset the device. For example, the temperature of the device could affect the actual voltage required.

Other conventional power-on-reset circuit blocks, rather than directly determining the voltage being input, employ a built-in time delay so that the reset signal (PORST) is not activated until a minimum amount of time has elapsed following the initial application of the power supply. A simple time delay does not test the level of the power supply voltage, but only delays passing the voltage to the device for a predetermined amount of time, which may over or under-estimate the actual time required to reach the minimum voltage level.

Hence, there is a need for an apparatus and a method of generating a power-on-reset signal or other device function activation signal that more accurately determines the minimum voltage input required to reset the device (or perform another device function) and only releases the signal when the input voltage is above an actual minimum required voltage, rather than a predetermined estimate. In addition, there is a need for a power-on-reset circuit that can provide an on-chip clock signal that will only clock when the input voltage is high enough for memory clearing and writing or some other device function (i.e. remains static until the power-on-reset signal changes state from 0 to 1).

BRIEF SUMMARY OF THE DISCLOSED SYSTEM

The present invention describes an apparatus and a method of generating a device activation signal to activate an integrated circuit device that only releases an activation signal when a voltage supplied to the device is above a minimum voltage required to actually activate the device. The device activation signal of the present system remains in logic 0 after power is applied to the device until the voltage supplied to the device is high enough so that a desired function can be performed. A threshold circuit determines when the function can be performed based on the input from at least one test circuit.

A better understanding of the features and advantages of the present disclosed system will be obtained by reference to the following detailed description of the disclosed system and accompanying drawings which set forth an illustrative embodiment in which the principles of the disclosed system are utilized.

BRIEF DESCRIPTION OF THE DRAWINGS

FIG. 1b is a simplified schematic diagram illustrating a typical memory cell as commonly used in the memory array of FIG. 1a.

DETAILED DESCRIPTION OF THE DISCLOSED SYSTEM

Those of ordinary skill in the art will realize that the following description of the present invention is illustrative only and not in any way limiting. Other embodiments of the invention will readily suggest themselves to such skilled persons.

Various aspects of the disclosure may be described through the use of flowcharts. Often, a single instance of an aspect of the present disclosure may be shown. As is appreciated by those of ordinary skill in the art, however, the protocols, processes, and procedures described herein may be repeated continuously or as often as necessary to satisfy the needs described herein. Accordingly, the representation of various aspects of the present disclosure through the use of flowcharts should not be used to limit the scope of the present disclosure.

In this disclosure, various circuits and logical functions are described. It is to be understood that designations such as "1" and "0" in these descriptions are arbitrary logical designations. In a first implementation of the invention, "1" may correspond to a voltage high, while "0" corresponds to a voltage low or ground, while in a second implementation, "0" may correspond to a voltage high, while "1" corresponds to a voltage low or ground. Likewise, where signals are described, a "signal" as used in this disclosure may represent the application, or pulling "high" of a voltage to a node in a circuit where there was low or no voltage before, or it may represent the termination, or the bringing "low" of a voltage to the node, depending on the particular implementation of the invention.

Figure 3:
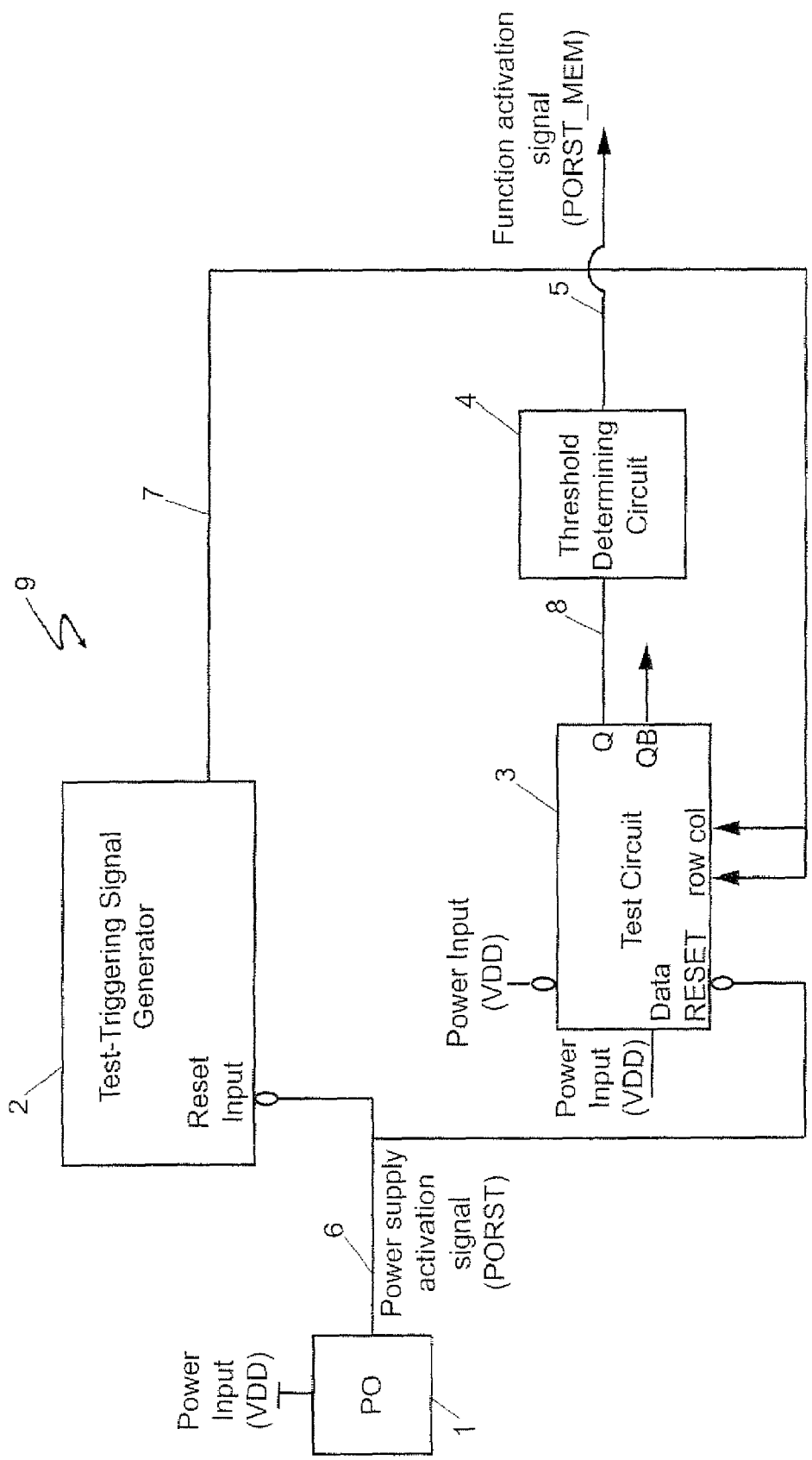
FIG. 3 shows a block diagram of a device activation circuit according to an embodiment of the present invention.

FIG. 3 shows a block diagram of a device activation circuit 9 according to an embodiment of the present invention. The activation circuit 9 provides a function activation signal to a device along signal line 5, and may be used, for example, in an integrated circuit device such as a field programmable gate array ("FPGA"), an application specific integrated circuit ("ASIC"), or other integrated circuit. The function activation signal may be, for example, a signal the device uses to reset itself. For example, in an FPGA including an array of SRAM memory cells, the function activation signal may be a power-on-reset-memory (PORST_MEM) signal that initializes the circuits that perform a memory clearing function on the memory cells and activates the circuits to clear the memory cells prior to the configuration bitstream being loaded.

In the embodiment shown in FIG. 3, the activation circuit includes a power-on ("PO") circuit 1, a test circuit 3, and a threshold decision circuit 4. An optional test-triggering signal generator circuit 2 may also be used in conjunction with the device activation circuit 9 of the present invention.

The PO circuit 1 receives a power supply input to the integrated circuit device and estimates whether the power supply has reached a predetermined minimum, for example by allowing a predetermined amount of time to elapse or measuring the voltage via analog circuit elements. The predetermined minimum voltage may be, for example, enough voltage to operate certain functions of the integrated circuit device, but not enough to operate device functions represented by the test circuit. In the embodiment shown in FIG. 3, the PO circuit outputs a power supply activation signal along signal line 6. The power supply activation signal may be sent to the test circuit 3, the test-triggering signal generator circuit 2, or both. The power supply activation signal indicates that the power supply has been activated and initializes the test-triggering signal generator circuit 2 and the test circuit 3. The PO circuit 1 may be designed to initialize and activate any kind of test implemented by the test circuit, either directly or via the test-triggering signal generator. For example, the PO circuit 1 may comprise a conventional power-on-reset ("POR") circuit of the type described above. The POR circuit will output a signal (e.g., PORST) when the power supply input voltage is sufficient to operate certain functions of the integrated circuit, but not to clear (or perform another function of) the test circuit. The signal also initializes the test circuit into an initial state. In this case, the output of the POR circuit may be a memory clear test activation signal.

In the embodiment shown in FIG. 3, the PO circuit outputs the test activation signal to a test-triggering signal generator circuit 2. The test-triggering signal generator circuit 2 may be, for example, a clock or other oscillator, or other pulse or function generator circuit as known in the art, designed to provide a start signal. When the test-triggering signal generator circuit 2 receives the test activation signal from the PO circuit 1, it generates a test-triggering signal on signal line 7 to indicate that the test circuit 3 is to begin performing its test function. The test activation signal may also serve to reset the test-triggering signal generator circuit. The test-triggering signal or a similar signal may also be sent to other components of the integrated circuit device as a global clock signal.

The test circuit 3 is a circuit designed help determine when the power supply voltage has reached a threshold level necessary to perform a function of the device so that the function may be activated. The test circuit 3 may model a function of the integrated circuit in order to determine when the power supply voltage has reached the threshold level. The test circuit 3 receives an initialization signal and a test activation signal. In some embodiments, the same signal (e.g., a power supply activation signal) may perform both initialization and test activation functions. In other embodiments, a test-triggering signal may perform the test activation function. When the test circuit 3 has received the test activation signal and a power supply input to the device is of a sufficient level to perform a function of the test circuit, the test circuit changes states and outputs a signal indicating that the power supply has reached a sufficient level for the test circuit's test function to be performed.

For example, in a device that includes an array of memory cells to be reset on power-up, the test circuit 3 may be a sample memory cell of the type found in the memory cell array. In this case, the test function may be a reset function of the test circuit 3. When the memory cell test circuit 3 is able to be reset by the input power supply, then the input power supply has reached a sufficient voltage to reset the cells of the memory array. Because, in this case, the threshold voltage is determined empirically, rather than being predefined (e.g., at a pre-selected voltage or by a time delay), changes in environment (e.g., temperature) will not significantly alter the accuracy of the threshold. Furthermore, the design of such a device will be more portable to a new manufacturing process, as a change to a new process may greatly impact the threshold voltage.

The test circuit 3 may be comprised of any of a number of different types of circuits. For example in a device with an array of circuits of a certain type, the test circuit may comprise a sample circuit of that type. The sample circuit may have the same parameters as each circuit in the array, or it may be constructed differently so that it more accurately models the features of an array, rather than a single circuit. For example, resistances and capacitances could be modified in the test circuit to more accurately model the characteristics of an array. In addition to the test circuit being a sample circuit, it could also be a selected circuit from within the array that serves as a test proxy for the rest of the array. Alternatively, the test circuit may be any of a number of circuit types that will accurately determine when a threshold voltage has been reached. For example, the test circuit could be a phase lock loop.

Returning to the description of FIG. 3, when the test of the test circuit 3 has been successfully performed (e.g., the test circuit changes state), the test circuit 3 will output a test result signal on signal line 8 indicating that the test has performed successfully. This test result signal (designated "Q" in FIG. 3) is sent to the threshold decision circuit 4.

The threshold decision circuit 4 is a circuit implementing a logic function to process the test result signal to determine whether a device function activation signal should be output, and then outputs the proper signal on signal line 5. The device function activation signal may be used, for example to initialize other circuits of the integrated circuit device. It may also activate a device function such as a memory clear via such other circuits, once they are initialized.

In embodiments of the invention that include multiple test circuits, multiple test result signals may be input to the threshold decision circuit 4. In these cases, the threshold decision circuit 4 performs a logic function (e.g., an AND function, an OR function, etc.) to determine whether a device function activation signal should be output. In different embodiments, the threshold decision circuit may output multiple different function activation signals based on the test result inputs. For example, one set of inputs may indicate that a reset function should be performed, while another set of inputs might indicate that a different function should be performed.

Based on the various test result signals input to the threshold decision circuit 4, the threshold decision circuit determines whether the voltage is at a sufficient level to activate a device function. If signal Q indicates that the test function has been performed successfully, then the threshold decision circuit will output an activation signal on signal line 5. In the embodiment shown in FIG. 3, there is only one test circuit 3 shown, however in other embodiments of the invention there may be multiple test circuits 3, each sending Q signals to the threshold decision circuit 4. The test circuits 3 may test for the same or different device functions to be activated.

The operation of the optional test-triggering signal generator 2 will be described below in the context of an embodiment of the invention used in connection with an array of memory cells, for example, in an FPGA. Although several embodiments of the invention described herein are relevant to SRAM-based FPGAs, it will be well understood by a person skilled in the art that the invention applies equally well to other types of devices.

Figure 1A:
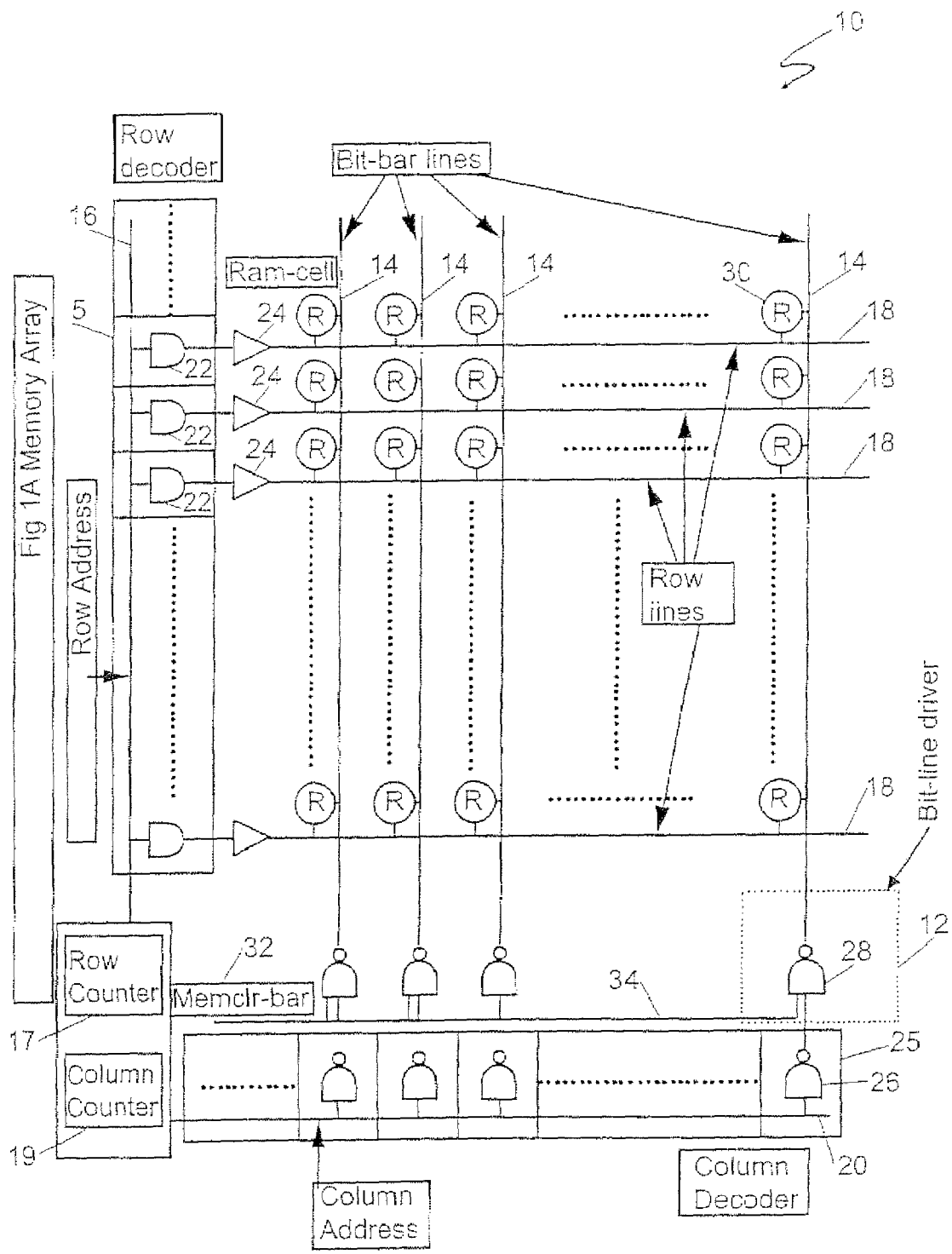
FIG. 1a is a simplified schematic diagram illustrating a typical memory array of a field programmable gate array.
Figure 1B:
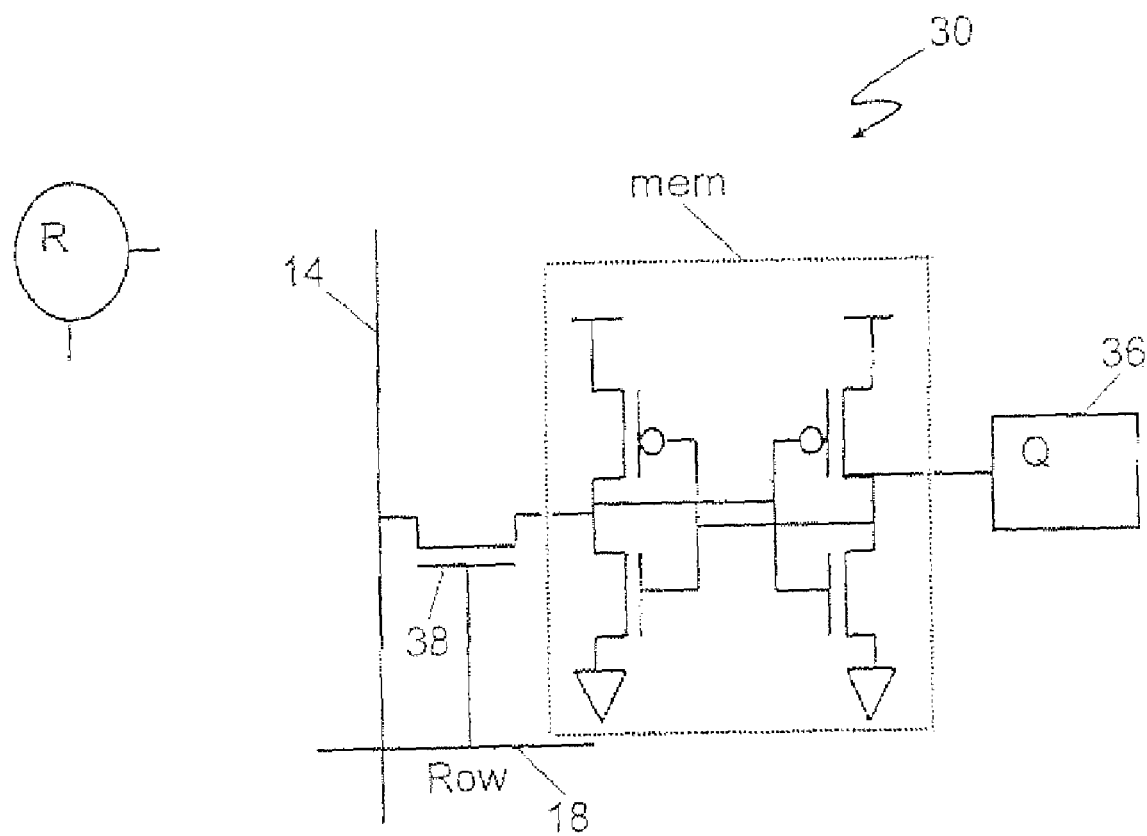
Figure 2A:
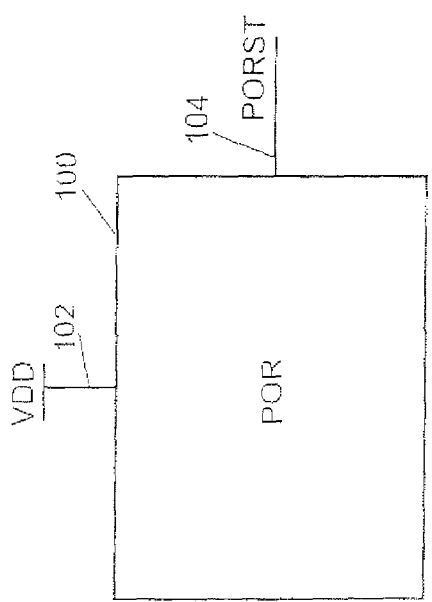
FIG. 2A is a simplified bock diagram of a conventional power-on-reset functional block.
Figure 2B:
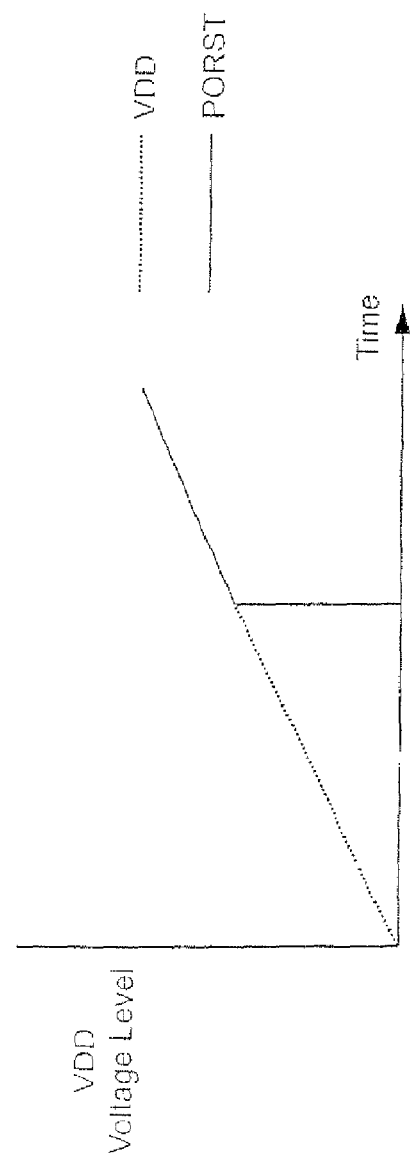
FIG. 2B is a graph illustrating the relationship between time and voltage level and a power-on-reset signal.
Figure 4:
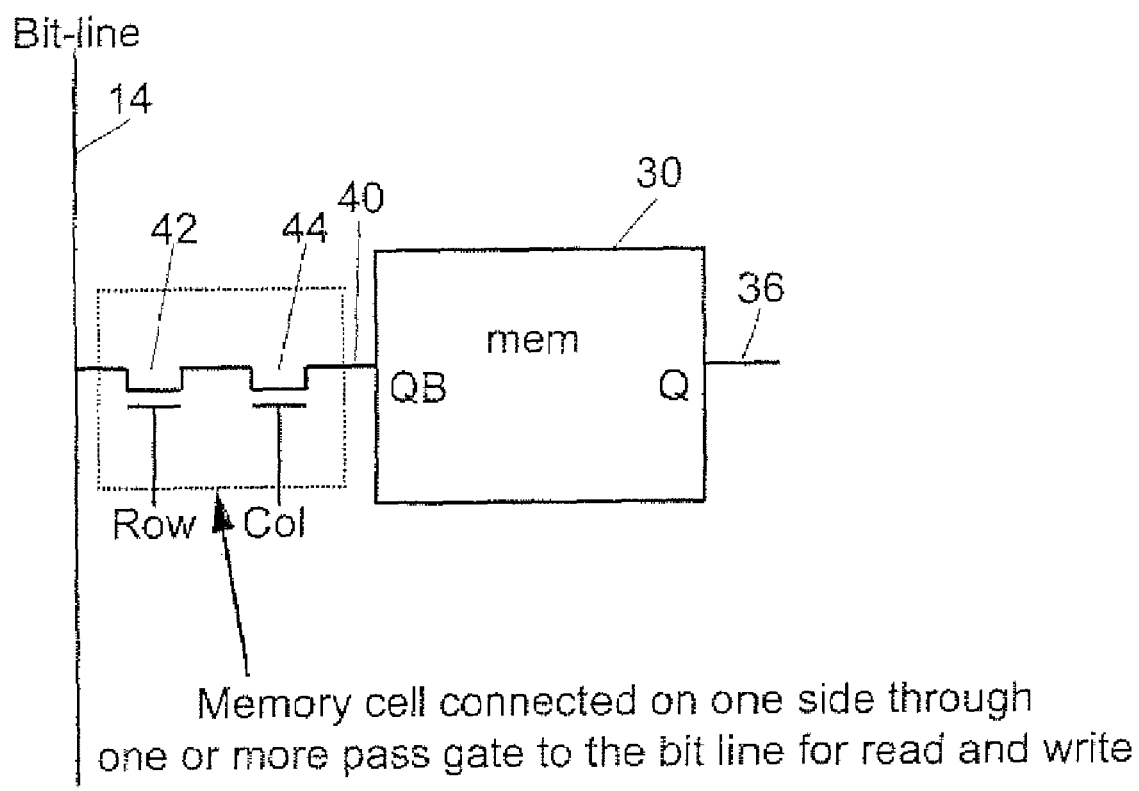
FIG. 4 is a simplified schematic diagram of memory cell of FIG. 1B coupled to the bit-line through a plurality of pass gates.

FIG. 4 is a simplified schematic diagram of memory cell 30 coupled to the bit-line through a plurality of pass gates. FIG. 4 illustrates memory cell 30 as used in the memory array as shown in FIG. 1 having one or a plurality of pass gates represented in FIG. 4 by reference numerals 42 and 44 in serial connection on one side of memory cell 30. In this embodiment, there are two pass gates in serial connection, pass gate 42 has its gate coupled to a row line and pass gate 44 has its gate coupled to a column line. In other embodiments, there may be only one pass gate on only one side of the memory cell, and a row control line.

Figure 5A:
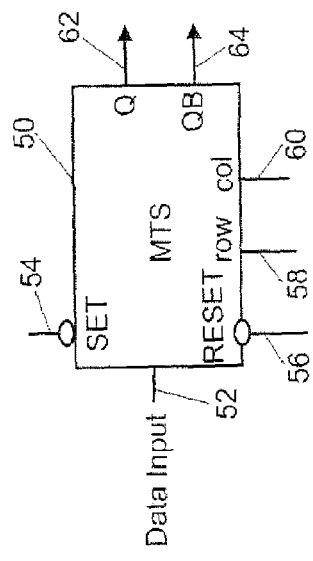
FIG. 5A illustrates an example of a test circuit of the present invention.

FIG. 5A illustrates an example of a test circuit. In this embodiment, the test circuit is a memory-test device (MTD). MTD 50 may be, for example, a sample memory cell of the type found in an array. MTD 50 has a data-input signal line 52, a set-signal input line 54, a reset-signal line 56, a row-control line 58, a column-control line 60, a Q output 62 and a QB output 64.

Figure 5B:
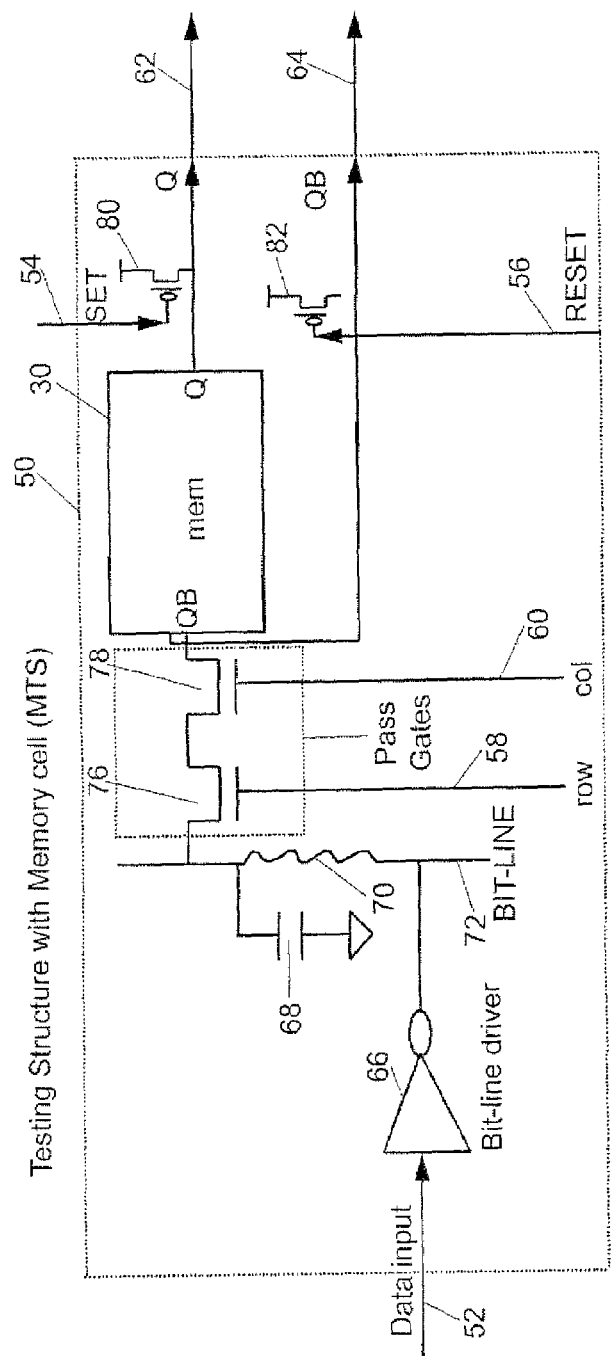
FIG. 5B is a simplified schematic diagram illustrating in further detail the memory test device (MTD) of FIG. 5A.

FIG. 5B is a simplified schematic diagram illustrating in further detail the memory test device (MTD) of FIG. 5A. In memory-test device 50, bit-line driver 66, memory cell 30 and pass gates 76 and 78 are identical to those used in conventional memory arrays. Data is written into the memory cell through bit-line driver 66, bit-line 72 and pass gates 76 and 78. Pass gates 76 and 78 have their gates coupled to row-control signal line 58 and column-control signal line 60 respectively.

Referring still to FIG. 5B, in MTD 50, a capacitor 68 and a resistor 70 has been added to bit-line 72 to emulate bit-line loading in the actual memory array on the FPGA device. In addition, in MTD 50, two additional pass gates 80 and 82 are included to preset the Q output and the QB output respectively. Pass gate 80 is coupled to Q output line 62. The gate of pass gate 80 is coupled to the output signal line 54 of a conventional power-on-reset block (not shown) to set Q to 1 upon applying the power supply. The gate of pass gate 82 is coupled to the output of the conventional power-on-reset block (not shown) to preset QB output 64 to 1, therefore reset Q to 0 through the memory cell, upon applying the power supply.

Figure 6:
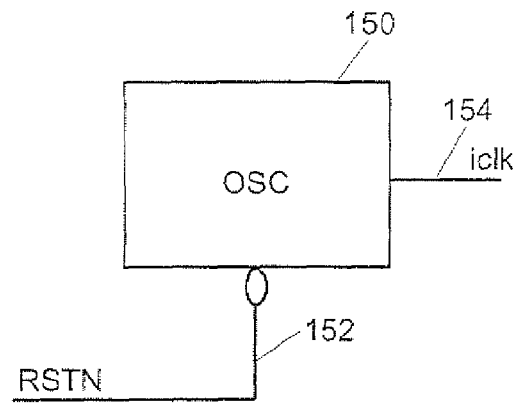
FIG. 6 is a simplified block diagram of an oscillator of a type that may be employed as part of the invention and a waveform generated by the oscillator.
Figure 6:
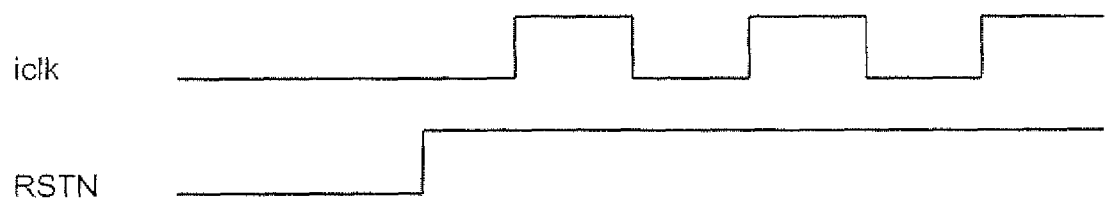

FIG. 6 is a simplified block diagram of an example of a test-triggering signal generator. In this case, the test triggering signal generator is a conventional oscillator. FIG. 5 also shows the waveform generated by the oscillator. Oscillator 150 receives a power supply indicator signal, in this case a reset signal through reset signal line 152 and generates a clock signal through clock signal line 154. Oscillator circuits are well known to those of ordinary skill in the art and will not be discussed in detail herein to avoid overcomplicating the disclosure and thereby obscuring the present invention. FIG. 5 shows the waveforms of the reset signal and the clock signal.

Figure 7:
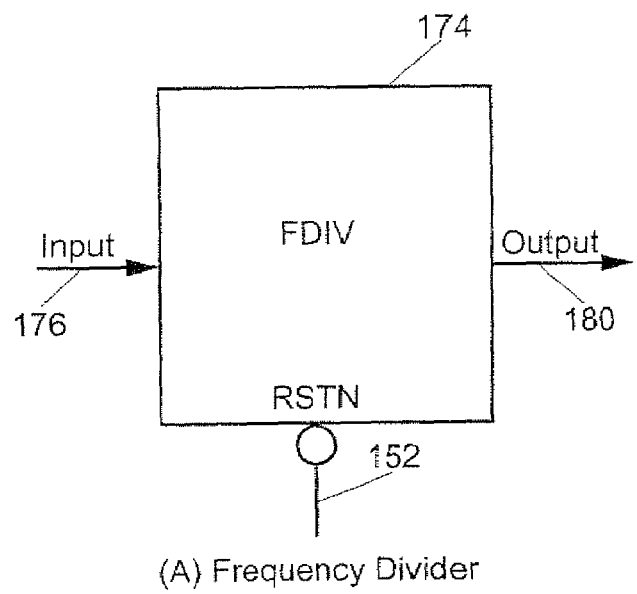
FIG. 7 is a simplified block diagram of a frequency divider of a type that may be employed as part of the invention and waveforms of an input signal, RSTN signal and output of the frequency divider.
Figure 7:
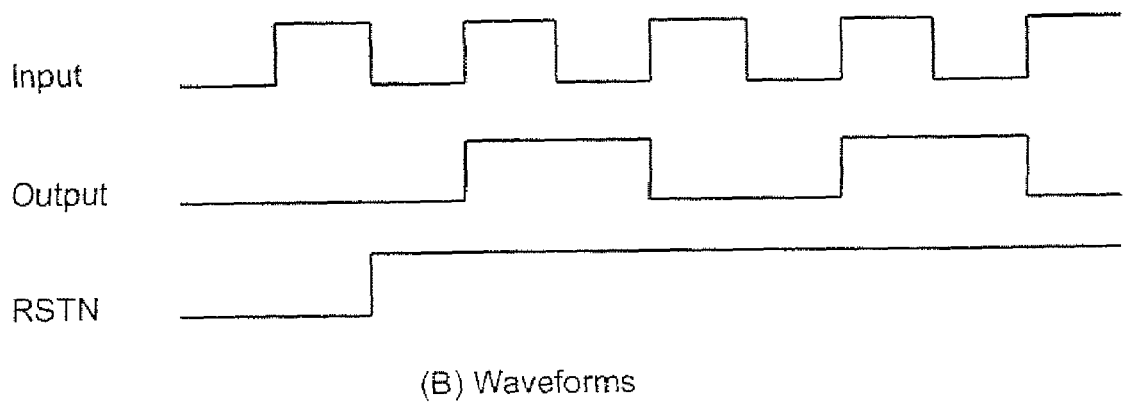

FIG. 7 is a simplified block diagram of a frequency divider and the waveforms of the input signal, RSTN signal and the output of the frequency divider circuit. Frequency divider circuits 174 are well known to those of ordinary skill in the art and will not be discussed herein to avoid overcomplicating the disclosure and thereby obscuring the present invention. Frequency divider circuit 174 has an input line 176, an input receiving a reset signal from reset signal line 152 and an output line 180. FIG. 7 also shows the waveforms of the input signal, the reset signal and the output signal.

Figure 8:
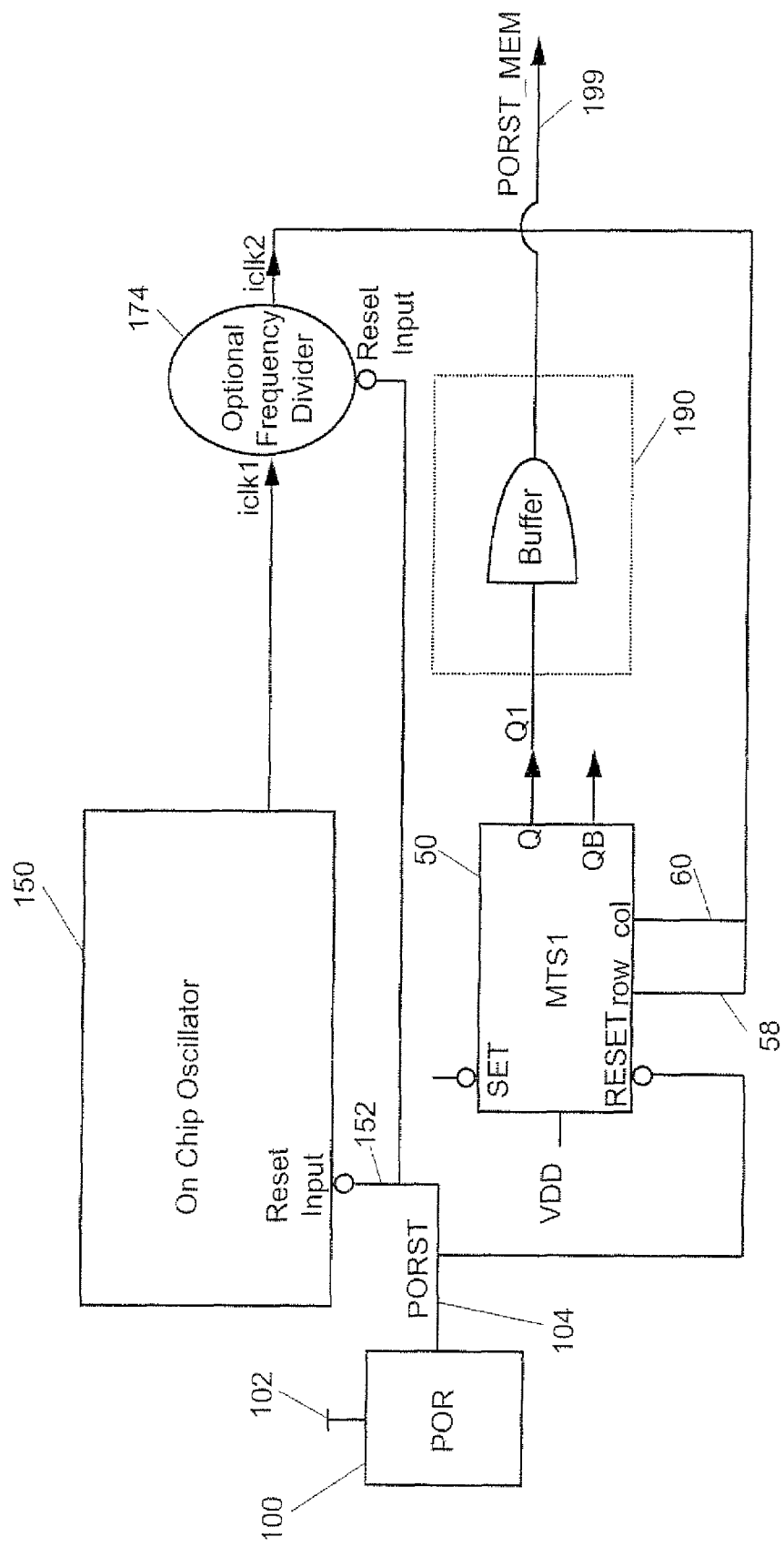
FIG. 8 is a simplified schematic diagram of a circuit incorporating a memory test device of a type that may be employed as a part of the present invention.

FIG. 8 is a simplified schematic diagram of a circuit according to an embodiment of the invention where the test circuit is an MTD circuit incorporating a memory test circuit. Power-on reset circuit 100 is coupled to the reset input of a test-triggering signal generator, in this case an on-chip oscillator 150 through reset line 152. Oscillator 150 has an output coupled to the input of frequency divider 174. Frequency divider 174 has an output coupled to the row-control line 58 input and the column-control line 60 input of MTD 50. MTD 50 has a data input coupled to VDD, a set input coupled to VDD and a reset input coupled to power-on-reset circuit 100 though power-on-reset signal line 104.

In another embodiment, MTD 50 may have a data input coupled to ground, a set input coupled to power-on-reset line 104. The reset input of MTD 50 may be coupled to VDD and the QB is utilized as the output of MTh 50 which is coupled to a threshold-determining circuit, in this case a buffer 190.

The output Q of MTD 50 is coupled to buffer 190 to produce a device function activation signal, in this case a power-on-reset memory signal through power-on-reset memory signal line 199. Thus, the power-on-reset memory signal is initially 0 and will only be 1 when the power-on-reset signal is 1 and when the memory in MTD 50(1) can be successfully written and cleared.

Figure 9:
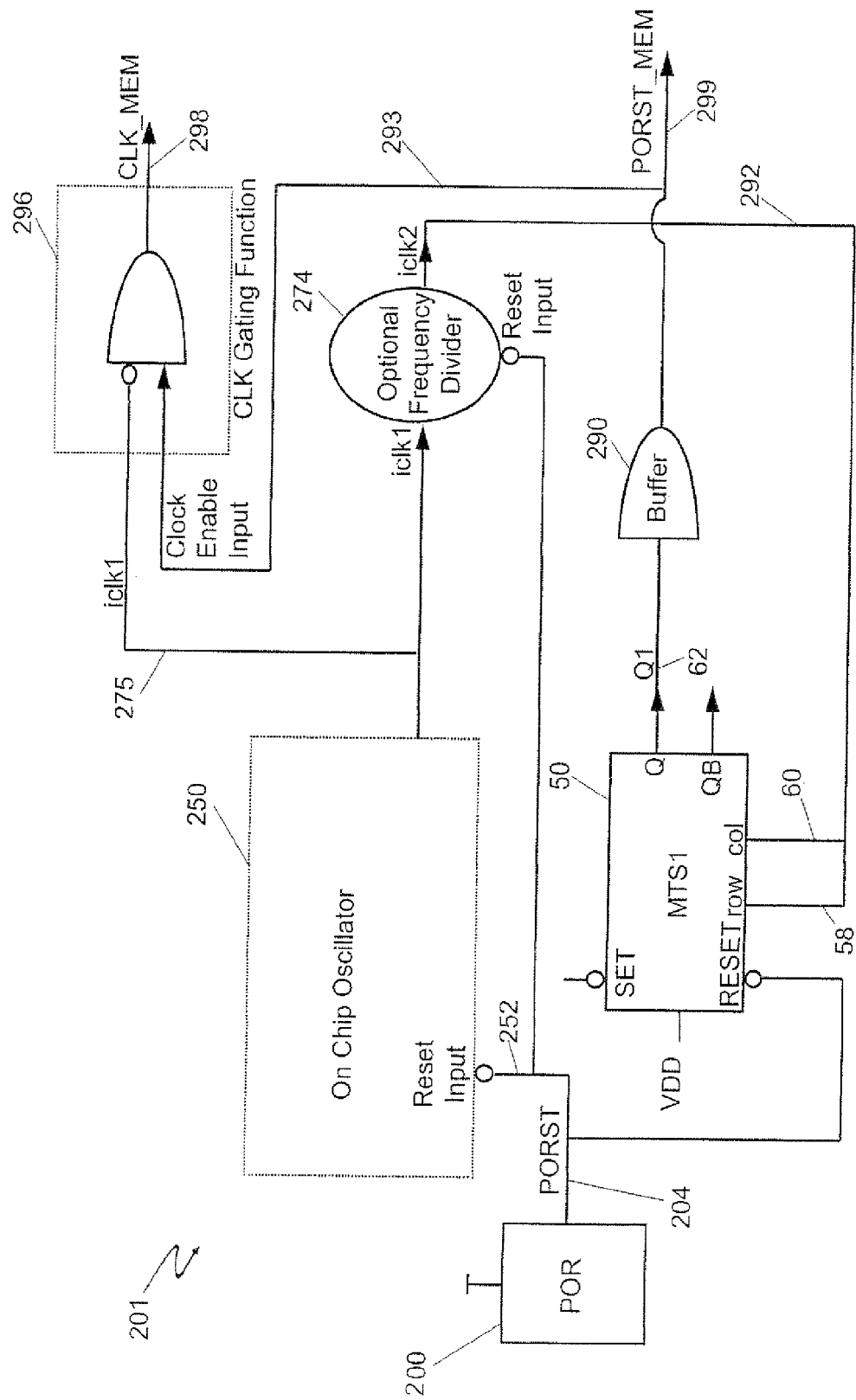
FIG. 9 is a simplified schematic diagram of another embodiment of a circuit incorporating a memory test device.

FIG. 9 is a simplified schematic diagram of another embodiment of a circuit according to the present invention. Power-on reset circuit 200 is coupled to the reset input of an on-chip oscillator 250 through reset line 252. Oscillator 250 has an output coupled to the input of frequency divider 274. Frequency divider 274 has an output coupled to the row-control line 58 input and the column-control line 60 input of MTD 50. MTD 50 has a data input coupled to VDD, a set input coupled to VDD and a reset input coupled to power-on-reset circuit 200 through power-on-reset signal line 204.

Referring still to FIG. 9, the apparatus 201 for generating the power-on-reset signals and clock signals is illustrated. To generate the power-on-clock reset signal, the output Q of MTD 50 is coupled to buffer 290 to produce power-on-reset memory signal through power-on-reset memory signal line 299. Thus, the power-on-reset memory signal is initially 0 and will only be 1 when the power-on-reset signal is 1 and when the memory in MTD 50(1) can be successfully written and/or cleared.

The method of generating the clock signal comprises coupling a power-on-reset output from a conventional power-on-reset circuit to the input of an oscillator circuit to produce a first clock signal. The output of the oscillator circuit is coupled to a first input of a two-input combinatorial circuit, such as a two-input AND gate and the output of buffer 290 is coupled to a second input of the two-input combinatorial circuit, such as a two-input AND gate wherein the output of the combinatorial circuit, such as a two-input AND gate carries a clock signal through a clock signal output line 298.

Figure 10:
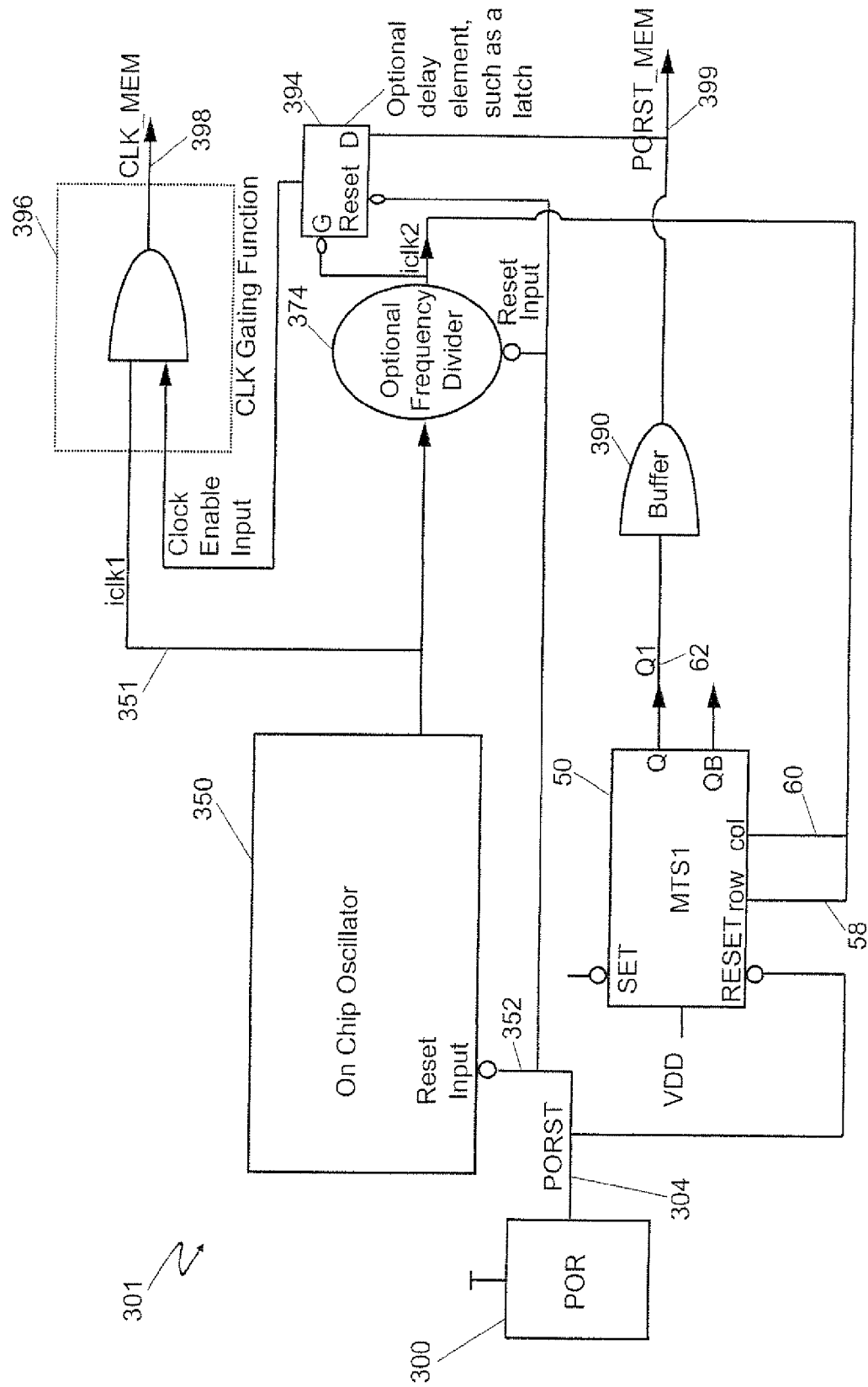
FIG. 10 is a simplified schematic diagram of yet another embodiment of a circuit incorporating a memory test device.

FIG. 10 is a simplified schematic diagram of yet another embodiment of a circuit 301 according to the present invention. Power-on reset circuit 300 is coupled to the reset input of an on-chip oscillator 350 through reset line 352. Oscillator 350 has an output coupled to the input of frequency divider 374. Frequency divider 374 has an output coupled to the row-control line 58 input and the column-control line 60 input of MTD 50. MTD 50 has a data input coupled to VDD, a set input coupled to VDD and a reset input coupled to power-on-reset circuit 300 though power-on-reset signal line 304.

Referring still to FIG. 10, the method of generating the clock signal comprises coupling a power-on-reset output from a conventional power-on-reset circuit to the input of an oscillator circuit to produce a first clock signal through line 351 and to couple the power-on-reset output to the reset input of a latch. The first clock signal may be, for example, the master clock signal for the device. The output of on-chip oscillator 350 is coupled to a first input of two-input AND gate 396 and is coupled to frequency divider 374. As would be obvious to anyone of ordinary skill in the art having the benefit of this disclosure, two-input AND gate 396 may comprise any two-input combinatorial circuit. Next, the output of frequency divider 374 is coupled to the input of latch 394. Frequency divider 374 generates a second clock signal from the first clock signal so that the second clock signal is at a desired frequency for clearing and programming operations on the MTD device(s). Finally, the output of latch 394 is coupled to a second input of the two-input AND gate wherein the output of the two-input AND gate carries a clock signal through a clock signal output line. Two-input AND gate generates the clock memory signal through clock memory signal line 398.

Referring still to FIG. 10, the method for generating the power-on-reset signals is illustrated. To generate the power-on-clock reset signal, the output Q of MTD 50 is coupled to buffer 390 to produce power-on-reset memory signal through power-on-reset memory signal line 399. Thus, the power-on-reset memory signal is initially 0 will only be 1 when the power-on-reset signal is 1 and when the memory in MTD 50(1) can be successfully written and cleared.

Figure 11:
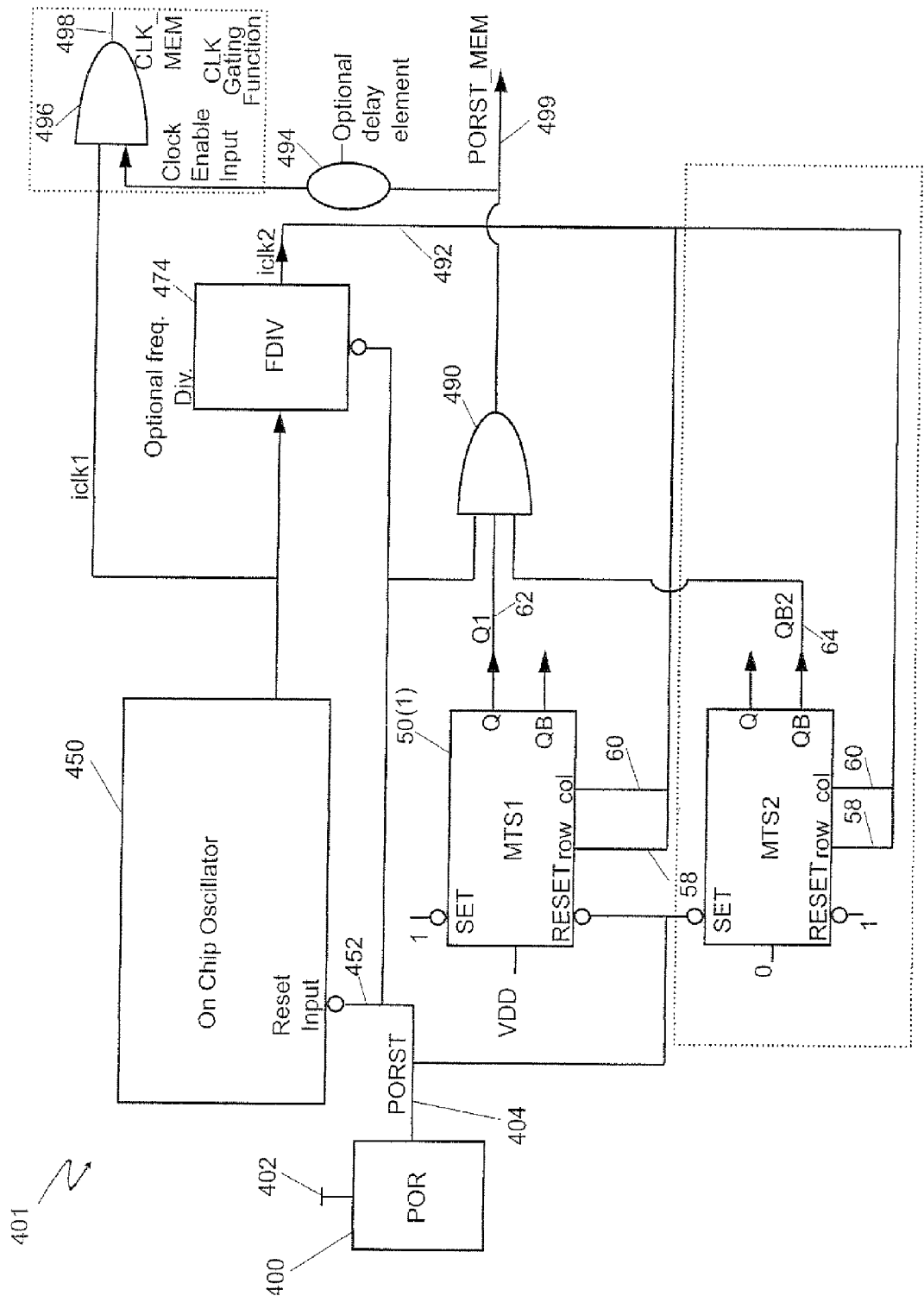
FIG. 11 is a simplified schematic diagram of yet another embodiment of a circuit incorporating a memory test device.

FIG. 11 is a simplified schematic diagram of yet another embodiment of a circuit 401 according to the present invention. Power-on reset circuit 400 is coupled to the reset input of oscillator 450 through reset line 452. Oscillator 450 has an output coupled to the input of frequency divider 474. Frequency divider 474 has an output coupled to the row-control line 58 inputs and the column-control line inputs of MTD 50(1) and MTD 50(2).

Power-on-reset circuit 400 is also coupled to the reset input of MTD 50 (1) and the preset input of MTD 50 (2). MTD 50(1) has a data input coupled to VDD and a reset input coupled to power-on-reset circuit 400 though power-on-reset signal line 404. MTD 50(1) has its row-control line 58 input and the column-control line 60 input coupled to frequency divider 474 through the clock 2 signal line 492. The Q output is coupled to one input of three-input AND gate 490, this three-input AND gate represents a three-input gating function which provides the power-on-reset memory signal as an output. As would be obvious to anyone of ordinary skill in the art having the benefit of this disclosure, three-input AND gate 490 may comprise any three-input combinatorial circuit.

MTD 50(2) has a data input coupled to ground and a preset input coupled to power-on-reset circuit 400 though power-on-reset signal line 404. MTD 50(2) has its row-control line 58 input and the column-control line input coupled to frequency divider 474 through clock 2-signal line 492. The QB output is coupled to a second input of three-input AND gate 490. AND gate 490 has its third input coupled to reset signal line 452 and an output that provides the power-on-reset memory signal through power-on-reset memory signal line 499.

Oscillator 450 has its output coupled to a first input of two-input AND gate 496. Two-input AND gate 496 represents a two-input combinatorial circuit block which produces the clock memory signal. Two-input AND gate 496 has a second input coupled to a delay element 494, such as a latch, that receives signal from power-on-reset memory signal line 499. Two-input AND gate 496 generates the clock memory signal through clock memory signal line 498.

Referring still to FIG. 11, the apparatus 401 for generating the power-on-reset signals and clock signals is illustrated. The method of generating the clock signal comprises coupling a power-on-reset output from a conventional power-on-reset circuit to the input of an oscillator circuit to produce a first clock signal. The output of the oscillator circuit is coupled to a first input of a two-input AND gate and the output of a delay element, such as a latch (where it receives its input from the power-on-reset memory signal), is coupled to a second input of the two-input AND gate 496 wherein the output of the two-input AND gate carries a clock signal through a clock signal output line 498.

The method of generating the power-on-reset signal 499 comprises coupling a power-on-reset output from a conventional power-on-reset circuit to the reset input of a first memory test device 50(1) and to the preset input of a second memory test device 50(2). The output of power-on-reset output from a conventional power-on-reset circuit is also coupled to the input of an oscillator circuit to produce a first clock signal and to a reset input of a latch. Next, the output of the oscillator circuit is coupled to a frequency divider to produce a second clock signal. The frequency divider has an output coupled to a row-control input and a column-control input of the first memory test device 50(1) and to a row-control input and a column-control input of the second memory test device 50(2). The data input of MTD 50(1) is coupled to VDD while the reset input is coupled to power-on-reset signal line 404 thus the Q output of MTh 50(1) is initially 0. When oscillator 450 begins to generate clock signals and the second clock signal pulses to 1, the bit-line driver will attempt to flip the Q output to 1. MTD 50(2) is coupled in such a way that its Q output initially generates a logic 1 signal and its QB output generates a logic 0. When the second clock signal pulses, the bit-line driver of MTD 50(2) will attempt to flip the signal generated by the Q output to 0 and QB will flip to 1.

The outputs Q of MTD 50(1), QB of MTD 50(2) and power-on-reset signal line 404 are coupled to a three-input AND gate 490 to produce power-on-reset memory signal through power-on-reset memory signal line 499. The power-on-reset memory signal is initially 0 and will only be 1 when the power-on-reset signal is 1 and when the memories in MTD 50(1) and MTD 50(2) can be successfully written and cleared. While in this embodiment, the threshold determining circuit (AND gate 496) performs an AND function, in other embodiments the threshold determining circuit may perform an OR, NAND, NOR, or other logical function. Two test circuits (MTD 50(1) and MTD 50(2)) are shown, but it is to be understood that any number of test circuits may be present, with the threshold determining circuit capable of performing more complicated logical operations for multiple inputs.

Figure 12:
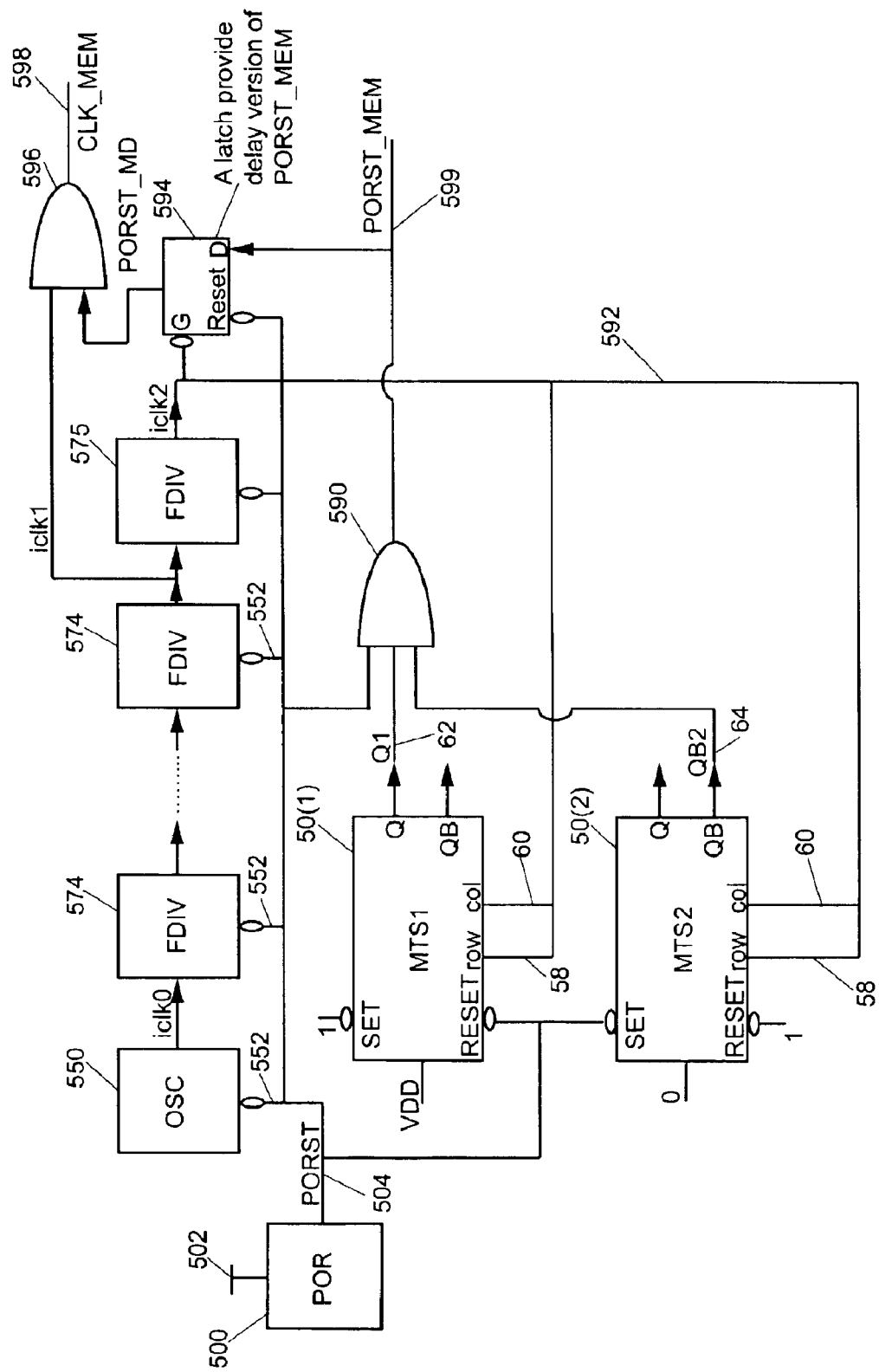
FIG. 12 is a simplified schematic diagram yet another embodiment of a circuit incorporating a memory test device.

FIG. 12 is a simplified schematic diagram yet another embodiment of a circuit according to the present invention. Power-on reset circuit 500 is coupled to the reset input of oscillator 550 through reset line 552. Oscillator 550 has an output coupled to the input of frequency divider 574. Frequency divider has its output coupled to the input of another frequency divider 574 and so on until the clock signal (iclk1) has the desired frequency used for memory clearing or programming. After the desired frequency is reached, the output of frequency divider 574 is once again coupled to the input of another frequency divider 575. Frequency divider 575 has an output coupled to the row-control line 58 inputs and the column-control line inputs of MTD 50(1) and MTD 50(2).

Power-on-reset circuit 500 is also coupled to the reset input of MTD 50(1) and the preset input of MTD 50 (2). MTD 50(1) has a data input coupled to VDD and a reset input coupled to power-on-reset circuit 500 though power-on-reset signal line 504. MTD 50(1) has its row-control line 58 input and the column-control line input coupled to frequency divider 575 through the clock 2 signal line 592. The Q output is coupled to one input of three-input AND gate 590. As would be obvious to anyone of ordinary skill in the art having the benefit of this disclosure, three-input AND gate 590 may comprise any three-input combinatorial circuit. MTD 50(2) has a data input coupled to ground and a preset input coupled to power-on-reset circuit 500 though power-on-reset signal line 504. MTD 50(2) has its row-control line 58 input and the column-control line input coupled to frequency divider 575 through clock 2-signal line 592. The QB output is coupled to a second input of three-input AND gate 590. AND gate 590 has its third input coupled to reset signal line 552 and an output that provides the power-on-reset memory signal through power-on-reset memory signal line 599.

The last frequency divider 574 in the series, as set forth above, also has its output coupled to a first input of two-input AND gate 596 that generates the clock memory signal (CLK_MEM) through clock memory signal line 598. As would be obvious to anyone of ordinary skill in the art having the benefit of this disclosure, two-input AND gate 596 may comprise any two-input combinatorial circuit. Two-input AND gate 596 has a second input coupled to a latch 594 that receives signal from power-on-reset memory signal line 599, reset signal line 552 and clock 2 signal line 592. Two-input AND gate generates the clock memory signal through clock memory signal line 598.

Referring still to FIG. 12, the apparatus 501 for generating the power-on-reset signals and clock signals is illustrated. The method of generating the clock signal comprises coupling a power-on-reset output to the reset input of a latch. The output of the oscillator circuit is coupled to a first frequency divider. Next, the output of the first frequency divider is coupled to the input of a second frequency divider and coupling the output of the second frequency divider to an Nth frequency divider such that the first clock signal reaches a desired frequency for clearing and programming operations. Finally, the output of said Nth frequency divider is coupled to a first input of a two-input AND gate and a latch is coupled to a second input of the two-input AND gate wherein the output of the two-input AND gate carries a clock signal through a clock signal output line.

The method of generating the power-on-reset memory signal 599 comprises coupling a power-on-reset output from a conventional power-on-reset circuit to the reset input of a first memory test device 50(1) and to the preset input of a second memory test device 50(2). The output of power-on-reset output from a conventional power-on-reset circuit is also coupled to the input of an oscillator circuit to produce a first clock signal and to a reset input of a latch. Next, the output of the oscillator circuit is coupled to a first frequency divider. Next, the output of the first frequency divider is coupled to the input of a second frequency divider and the output of the second frequency divider is coupled to an Nth frequency divider such that the first clock signal reaches a desired frequency for clearing and programming operations. The output of said Nth frequency divider 574 is coupled to an N+1 frequency divider 575 to produce a second clock signal, the N+1 frequency divider having an output coupled to a row-control input and a column-control input of the first memory test device 50(1) and to a row-control input and a column-control input of the second memory test device 50(2). The data input of MTD 50(1) is coupled to VDD while the reset input is coupled to power-on-reset signal line 504 thus the Q output of MTD 50(1) is initially 0. When oscillator 550 begins to generate clock signals and the second clock signal pulses to 1, the bit-line driver will attempt to flip the Q output to 1. MTh 50(2) is coupled in such a way that its Q output initially generates a logic 1 signal and its QB output generates a logic 0. When the second clock signal pulses, the bit-line driver of MTD 50(2) will attempt to flip the signal generated by the Q output to 0 and QB will flip to 1.

The outputs Q of MTD 50(1), QB of MTD 50(2) and power-on-reset signal line 504 are coupled to a three-input AND gate to produce power-on-reset memory signal through power-on-reset memory signal line 599. The power-on-reset memory signal is initially 0 and will only be 1 when the power-on-reset signal is 1 and when the memories in MTD 50(1) and MTD 50(2) can be successfully written and cleared.

Thus, the same kind of memory cells with the same kinds of pass gates and bit-line drivers in the memory array can also be cleared and written. The power-on-reset memory signal can also be used as a general-purpose power-on-reset signal having a higher level of reliability because it will stay at logic 0 until the second clock signal pulses and VDD is higher than VDD_MIN.

Figure 13:
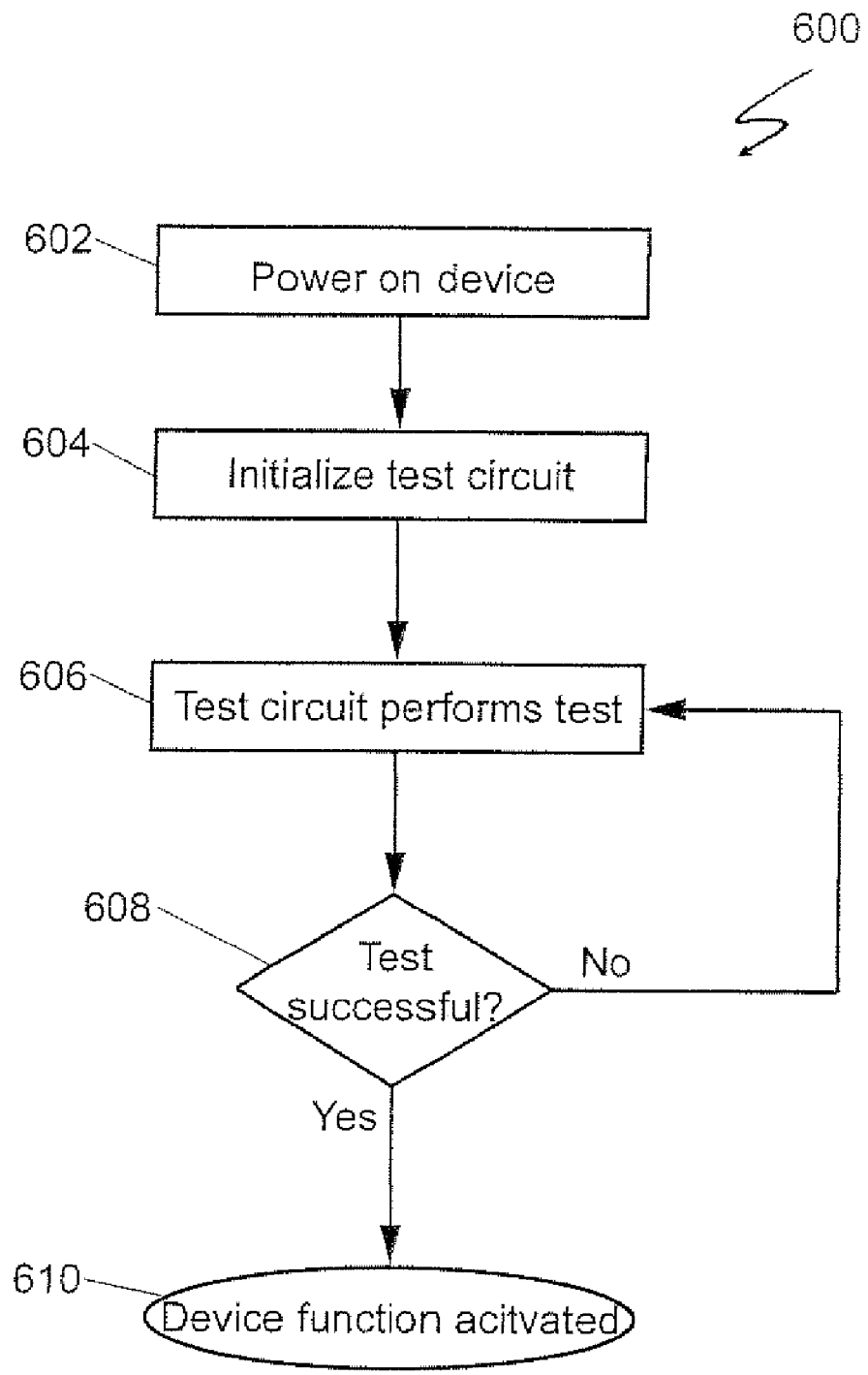
FIG. 13 is a flowchart illustrating a method of a testing a circuit according to the present invention.

FIG. 13 is a flowchart illustrating a method 600 of testing a circuit according to the present invention. First, at act 602, a device is powered on. Next, the test circuit is initialized at act 604. At act 606, the test circuit performs the test on the device. At query 608, the test circuit determines whether the test was successful. If the test was not successful, the test circuit continues performing the test. If the test is successful, the device function tested is activated.

Figure 14:
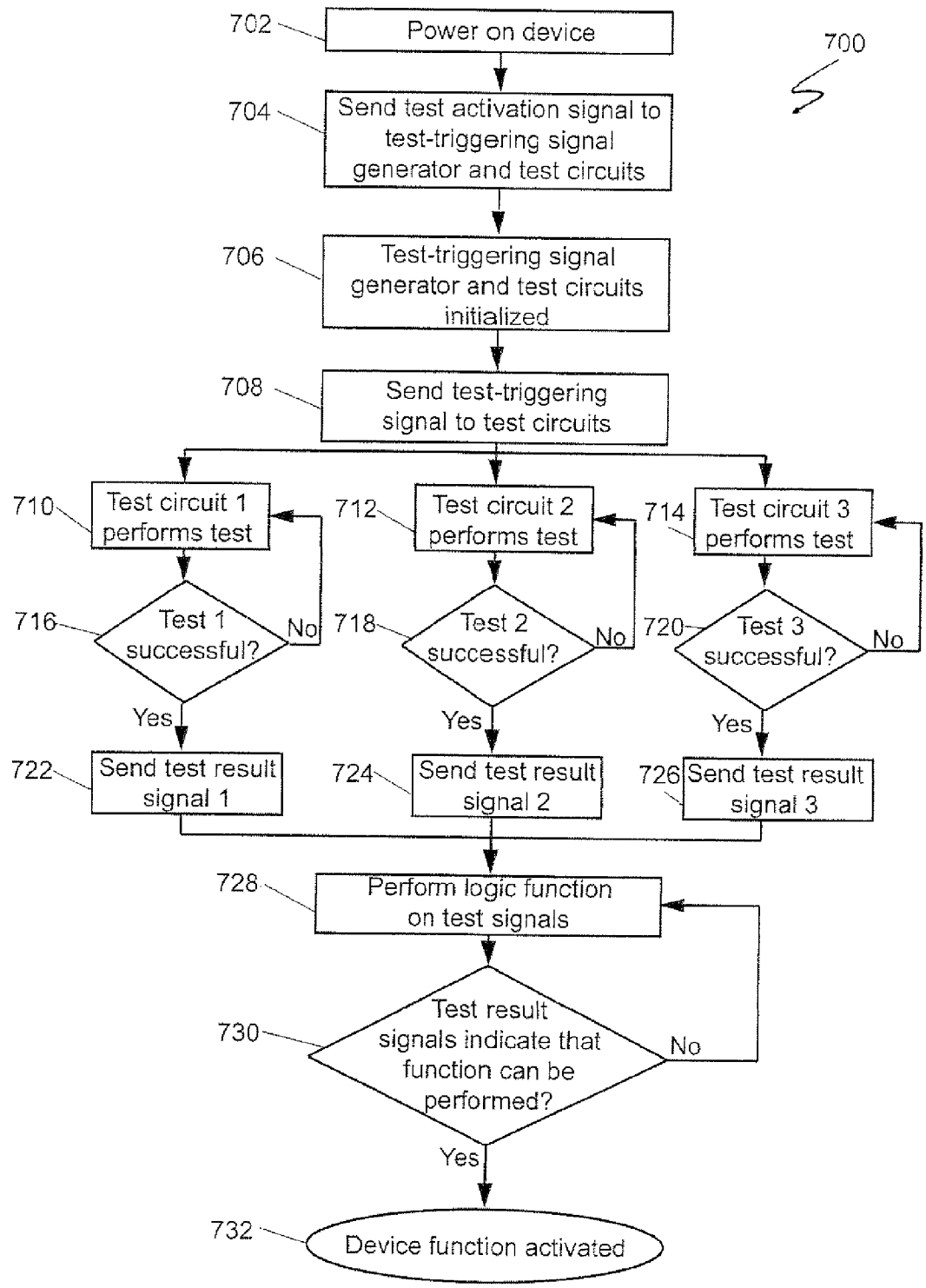
FIG. 14 is a more detailed flowchart illustrating a method of testing a circuit according to the present invention.

FIG. 14 is a more detailed flowchart illustrating another method 700 of testing a circuit according to the present invention. Method 700 employs multiple test circuits as described in previous embodiments in this application. First, at act 702, the device is powered on. Next, the test activation signal is sent to the test triggering signal generator and to the test circuits at act 704. At act 706, the test triggering signal and the test circuits are initialized. The test-triggering signals are then sent to the test circuits. At act 710, test circuit 1 performs the test on the circuit. At act 712, test circuit 2 performs the test on a circuit and at act 714 test circuit 3 performs a test on a circuit. At query 716, it is determined whether test 1 was successful. If test 1 was not successful, the test circuit continues performing the test at act 710. If the test was successful, the test result signal is sent at act 722. At query 718, it is determined whether test 2 was successful. If test 2 was not successful, the test circuit continues performing the test at act 712. If the test was successful, the test result signal is sent at act 724. At query 720, it is determined whether test 3 was successful. If test 3 was not successful, the test circuit performs the test again at act 714. If the test was successful, the test result signal is sent at act 726. At act 728, logic functions are performed on test results signals 1, 2 and 3. At query 730, it is determined whether the test result signals indicate that the function can be performed. If it is determined that the function cannot be performed, the test circuit performs logic functions on the signals at act 728. If it is determined that the function can be performed, the device function is activated at act 732.

From this disclosure, it will be apparent to persons of ordinary skill in the art that various alternatives to the embodiments of the disclosed system described herein may be employed in practicing the disclosed system. It is intended that the following claims define the scope of the disclosed system and that structures and methods within the scope of these claims and their equivalents be covered thereby.

What is claimed is:

1. An apparatus configured to generate a power-on-reset using a power-on-reset signal line, said apparatus comprising:
   a power-on-reset circuit having an input and an output;
   an oscillator circuit having an input and an output, said input coupled to said output of said power-on-reset circuit;
   at least one memory test device having a data input, an output, a set input, a reset input, a row-control signal line, and a column-control signal line, one of said set input and said reset input of each said at least one memory test device coupled to said output of said power-on-reset circuit, said row-control signal line and said column-control signal line coupled to said output of said oscillator circuit; and
   a buffer having an input and an output, said input coupled to said output of said memory test device and said output coupled to said power-on-reset signal line.

2. The apparatus of claim 1 wherein said data input is coupled to a VDD power line when said reset input is coupled to said output of said power-on-reset circuit.

3. The apparatus of claim 1 wherein said data input is coupled to ground when said set input is coupled to said output of said power-on-reset circuit.

4. The apparatus of claim 1 wherein said oscillator is coupled to said row-control signal line and a column-control signal line of said memory test device through a frequency divider.

5. The apparatus of claim 1 wherein said memory test device further comprises a memory cell coupled to a data input line through a bit-line driver, a bit-line and a plurality of pass-transistors.

6. The apparatus of claim 5 wherein said bit-line is coupled to a resistor and a capacitor.

7. An apparatus configured to generate a power-on-reset memory signal through a power-on-reset memory signal line and a clock signal through said power-on-reset memory signal output line, said apparatus comprising:
   a power-on-reset circuit having an input and an output;
   an oscillator circuit having an input and an output, said input coupled to said output of said power-on-reset circuit;
   at least one memory test device having a data input, an output, a set input, a reset input, a row-control signal line, and a column-control signal line, one of said set input and said reset input of each said at least one memory test device coupled to said output of said power-on-reset circuit, said row-control signal line and said column-control signal line coupled to said output of said oscillator circuit; and
   a buffer having an input and an output, said input coupled to said output of said memory test device and said output coupled to said power-on-reset memory signal line.

8. The apparatus of claim 3 wherein said data input is coupled to a VDD power line when said reset input is coupled to said output of said power-on-reset circuit.

9. The apparatus of claim 3 wherein said data input is coupled to ground when said set input is coupled to said output of said power-on-reset circuit.

10. The apparatus of claim 3 further comprising a two-input combinatorial circuit having a first input, a second input, and an output, said first input coupled to said output of said oscillator circuit, said second input coupled to said output of said buffer, and said output coupled to a clock memory signal line.

11. The apparatus of claim 3 wherein said oscillator is coupled to said row-control signal line and a column-control signal line of said memory test device through a frequency divider.

12. The apparatus of claim 3 wherein said memory test device further comprises a memory cell coupled to a data input line through a bit-line driver, a bit-line and a plurality of pass-transistors.

13. The apparatus of claim 12 wherein said bit-line is coupled to a resistor and a capacitor.

14. The apparatus of claim 10 wherein said output of said buffer is coupled to said second input of said two-input combinatorial circuit through a delay element.

15. An apparatus configured to generate a power-on-reset and a clock signal comprising:
   a power-on-reset circuit having an output coupled to a first input of a three-input combinatorial circuit;
   an oscillator circuit having an input and an output, said input coupled to said output of said power-on-reset circuit, said output coupled to a plurality of frequency dividers having a first output carrying a first clock signal, and said second output carrying a second clock signal;
   a first memory test device having a data input, a rest input, a row-control signal, a column-control signal, and an output, said data input coupled to VDD, said reset input coupled to said output of said a power-on-reset circuit, said row-control signal line and said column-control signal line coupled to said second output of said plurality of frequency dividers, and said output coupled to a second input of said three-input combinatorial circuit;
   a second memory test device having a data input, a preset input, a row-control signal line, a column-control signal line, and an output, said data input coupled to ground, said preset input coupled to said output of said a power-on-reset circuit, said row-control signal line and said column-control signal line coupled to said second output of said plurality of frequency dividers, and said output coupled to a third input of said three-input combinatorial circuit;
   a power-on-reset memory signal line coupled to an output of said three-input combinatorial circuit and configured to carry said power-on-reset memory signal;
   a latch having first input, a second input, a third input, and an output, said first input coupled to said output of power-on-reset circuit, said second input coupled to said output of said second output of said frequency divider, and said third input coupled to said output of said three-input combinatorial circuit; and
   a two-input combinatorial circuit having a first input, a second input, and an output, said first input coupled to said first output carrying a first clock signal of said plurality of frequency dividers, said second input coupled to said output of said latch, and said output coupled to said clock memory signal line.

16. The apparatus of claim 15 wherein said memory test device further comprises a memory cell coupled to a data input line through a bit-line driver, a bit-line and a plurality of pass-transistors.

17. The apparatus of claim 16 wherein said bit-line is coupled to a resistor and a capacitor.

18. A method of generating a power-on-reset clock signal immediately after power up comprising:
   coupling an input of an oscillator circuit to an output of a power-on-reset circuit;
   coupling a reset input of a memory test device to said output of said power-on-reset circuit, wherein said data input of said memory test device is coupled to a VDD power line,
   coupling a row-control signal line and a column-control signal line of said memory test device to an output of said oscillator circuit;
   coupling a buffer having an input to an output of said memory test device; and
   coupling an output of said buffer to a power-on-reset signal line.

19. The method of claim 18 further comprising:
   coupling said oscillator to said row-control signal line and said column-control signal line of said memory test device through a frequency divider.

20. The method of claim 18 wherein said memory testing device further comprises a memory cell coupled to a data input line through a bit-line driver, a bit-line and a plurality of pass-transistors.

21. The method of claim 20 wherein said bit-line is coupled to a resistor and a capacitor.

* * * * *